US006777312B2

(12) United States Patent
Yang et al.

(10) Patent No.: US 6,777,312 B2
(45) Date of Patent: Aug. 17, 2004

(54) WAFER-LEVEL TRANSFER OF MEMBRANES IN SEMICONDUCTOR PROCESSING

(75) Inventors: Eui-Hyeok Yang, Arcadia, CA (US); Dean V. Wiberg, La Crescenta, CA (US)

(73) Assignee: California Institute of Technology, Pasadena, CA (US)

(*) Notice: Subject to any disclaimer, the term of this patent is extended or adjusted under 35 U.S.C. 154(b) by 152 days.

(21) Appl. No.: 10/005,765

(22) Filed: Nov. 2, 2001

(65) Prior Publication Data

US 2002/0106867 A1 Aug. 8, 2002

Related U.S. Application Data

(60) Provisional application No. 60/245,650, filed on Nov. 2, 2000, and provisional application No. 60/307,677, filed on Jul. 24, 2001.

(51) Int. Cl.[7] .......................... H01L 21/30; H01L 21/46
(52) U.S. Cl. ....................... 438/464; 438/458; 438/459
(58) Field of Search ................................ 438/458, 459, 438/469

(56) References Cited

U.S. PATENT DOCUMENTS

| | | | |
|---|---|---|---|
| 4,383,886 A | | 5/1983 | Nakamura et al. |
| 4,700,467 A | | 10/1987 | Donzelli |
| 4,784,970 A | * | 11/1988 | Solomon .................... 438/406 |
| 4,794,092 A | * | 12/1988 | Solomon .................... 438/109 |
| 5,185,292 A | * | 2/1993 | VanVonno et al. ............. 438/59 |
| 5,827,755 A | * | 10/1998 | Yonehara et al. ............. 438/30 |
| 6,004,867 A | * | 12/1999 | Kim et al. .................. 438/459 |
| 6,013,534 A | * | 1/2000 | Mountain .................... 438/15 |
| 6,322,903 B1 | * | 11/2001 | Siniaguine et al. ......... 428/617 |
| 6,455,398 B1 | * | 9/2002 | Fonstad et al. ............. 438/459 |
| 6,521,477 B1 | * | 2/2003 | Gooch et al. ............... 438/106 |

OTHER PUBLICATIONS

Y. T. Chen, "Localized Bonding with PSG or Indium Solder as Intermediate Layer", 1999 IEEE.*
Michael M. Maharbiz, "Batch Micropackaging by Compression–Bonded Wafer—Wafer Transfer", 1999 IEEE.*
K.F. Harsh, W. Zhang, V.M. Bright and Y.C. Lee, "Flip–Chip Assembly for Si–Based RF MEMS", Proc. MEMS '99, Orlando, Florida, pp. 273–278, Jan. 1999.
T. Akiyama, U. Stzufer and N de Rooij, "Wafer–and Piece—Wise Si Tip Transfer Technologies for Applications in Scanning Probe Microscopy", IEEE Journal of Microelectromechanical Systems, pp. 65–70, 1999.
A. Singh, D.D. Horsley, M. Cohn, A. Pisano and R.T. Howe, "Batch Transfer of Microstructures using Flip–Chip Solder Bonding", IEEE Journal of Microelectromechanical Systems, pp. 27–33 1999.
H. Nguyen, P. Patterson, H. Toshiyoshi and M.C. Wu, "A Substrate–Independent Wafer Transfer Technique for Surface–Micromachined Devices", Proc MEMS Conference, 2000.
TE Bell and KD Wise, "A dissolved wafer process using a porous silicon . . . " Proc MEMS 98, Heidleberg Germany, Jan. 25–29,1998, pp. 251–256.
CG Keller and RT Howe, "Hexile tweezers for teleoperated micro–assembly", Proc MEMS 97, Nagoya, Japan, 1997 pp. 72–77.

* cited by examiner

Primary Examiner—Kamand Cuneo
Assistant Examiner—James Mitchell
(74) Attorney, Agent, or Firm—Fish & Richardson P.C.

(57) ABSTRACT

Techniques for transferring a membrane from one wafer to another wafer to form integrated semiconductor devices.

32 Claims, 10 Drawing Sheets

WAFER-LEVEL TRANSFER OF MEMBRANES IN SEMICONDUCTOR PROCESSING

This application claims the benefits of U.S. Provisional Application Nos. 60/245,650 filed Nov. 2, 2000 and 60/307,677 filed Jul. 24, 2001.

ORIGIN OF THE INVENTION

The systems and techniques described herein were made in the performance of work under a NASA contract, and are subject to the provisions of Public Law 96-517 (35 USC 202) in which the Contractor has elected to retain title.

BACKGROUND

This application relates to semiconductor processing, and more specifically, to transfer of a layered structure such as a membrane from one wafer to another wafer.

A semiconductor wafer can be processed to fabricate various structures in an integrated package. Such structures may be formed from fabricating and patterning various layers on the wafer using various microfabrication processes. Each layer may be a semiconductor material, a conductor material such as a doped semiconductor material and a metal, or an insulator such as a glass, an oxide or a nitride. In addition, various micromachining processes may be used to fabricate various micro structures on the wafer. The microfabrication and micromachining processes can be used to fabricate a variety of integrated semiconductor structures to form semiconductor components, devices and systems, including integrated circuits, opto-electronic devices, micro optical devices, and micro-electromechanical systems (MEMS).

A layered structure such as a membrane is a common structure in fabricating many semiconductor devices and systems. For example, a silicon or polysilicon membrane parallel to the wafer may be used as an optical mirror. In adaptive optics, such a membrane may be engaged to microactuators to deform in a controlled manner to correct distortions in the wavefront of received optical images. This layered structure may be "natively" grown by directly forming the layer on the wafer on which the final device is fabricated. Alternatively, it may be advantageous or necessary to fabricate such a layer on a separate substrate and then transfer the layer onto the wafer on which the final device is fabricated.

SUMMARY

This application includes techniques for transferring a membrane from one wafer to another wafer to form integrated semiconductor devices. According to one embodiment, a carrier wafer is fabricated to include a membrane on one side of the carrier wafer. The membrane on the carrier wafer is then bond to a surface of a different, device wafer by a plurality of joints. The joints and the device wafer are then isolated from exposure to etching chemicals. Next, the carrier wafer is selectively etched away to expose the membrane and to leave said membrane on the device wafer.

DETAILED DESCRIPTION

The present techniques for transfer of membranes are used to transfer a layered structure such as a membrane fabricated in a carrier wafer to another "device wafer" on which a device or system is fabricated using the transferred membrane. In general, the present techniques include three basic fabrication stages: wafer preparation, hermetic wafer bonding, and selective removal of the carrier wafer. In the wafer preparation stage, the carrier and the device wafers are prepared to form surface structures for the final device such as patterns on the membrane in the carrier wafer, patterns and electrodes on the device. In addition, bonding structures or joints may also be fabricated for bonding the carrier and device wafers together. Next in the wafer bonding stage, a direct bonding process is used to form hermetic bonding between two wafers. The hermetic nature of the bonding is desirable because the subsequent fabrication relies on the hermetic seal at the bonding locations to select certain portions of the carrier wafer to etch for the transfer. Various fabrication steps may be implemented in the above three stages to transfer different membranes. The selective removal of the carrier wafer to release the membrane includes isolation of the device wafer and the bonding structure between the membrane and the device wafer from any etching chemicals. This isolation protects the bonding between the membrane and the device wafer and allows a variety bonding materials to be used, such as indium bumps and epoxy materials.

Figure 1A:
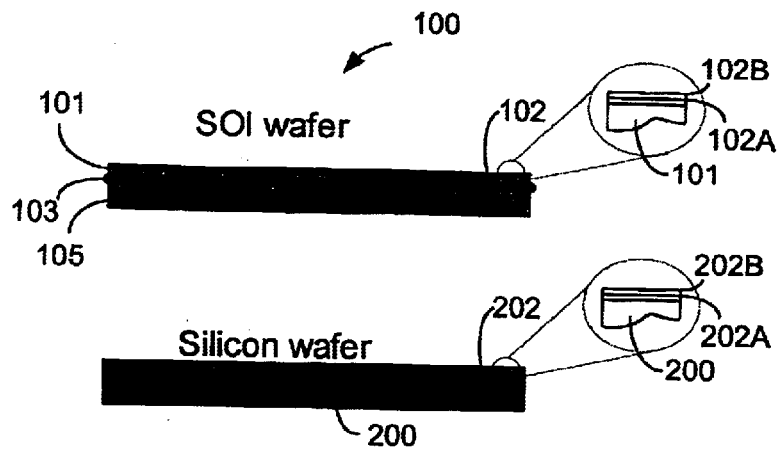
FIGS. 1A and 1B illustrate preparation of a carrier wafer and a device wafer for transferring a membrane in the carrier wafer to the device wafer according to one embodiment.
Figure 1B:
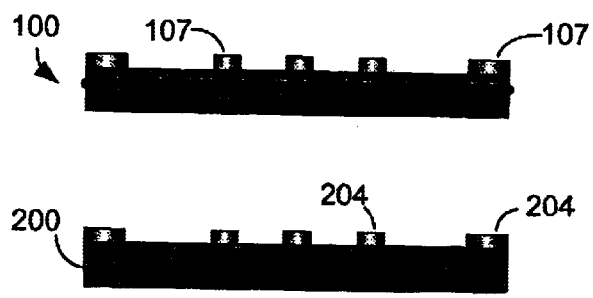
Figure 2:
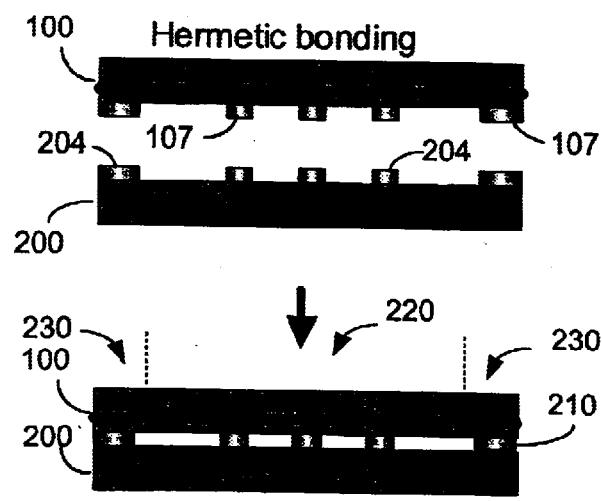
FIG. 2 illustrates bonding of the carrier wafer to the device wafer according to one embodiment.

FIGS. 1A through 4B illustrate transfer of a single-crystal semiconductor membrane 101 from a carrier wafer 100 to a device wafer 200 according to one embodiment. More specifically, FIGS. 1A and 1B illustrate the wafer preparation; FIG. 2 illustrates the hermetic bonding; and FIGS. 3A through 4B illustrate the selective etching of the bonded carrier wafer.

Referring to FIG. 1A, the carrier wafer 100 is a silicon-on-insulator (SOI) wafer which includes the silicon membrane 101 (e.g. on the order of one micron to tens of microns), a thick single-crystal silicon layer 105 (e.g., a few hundred microns), and a thin insulator layer 103 of less than one micron formed of an insulating material such as a silicon oxide and a silicon nitride and sandwiched between the silicon layers 101 and 105. The insulator layer 103 is assumed to be silicon dioxide as an example in the following description. A semiconductor other than silicon may be used for the wafers 100 and 200, including germanium, a III–V compound like GaAs and GaP, and a II–VI compound. The use of GaAs and other semiconductors for semiconductor opto-electronic devices as the device wafer 200 allows for integration opto-electronic components in the final device.

A thin oxide layer 102A, e.g., silicon dioxide of about 0.5 micron, is thermally grown over the surface of the membrane 101 on the carrier wafer 100. At this stage, the membrane 101 may be etched to form various surface patterns. Next, a photoresist layer is formed and patterned to define locations of indium bumps 107 to be formed on the membrane 101 for hermetic bonding to the device wafer 200. A metallization layer 102B of Cr/Pt/Au is deposited subsequently over the patterned photoresist layer for a subsequent lift-off process. The silicon device wafer 200 may be similarly prepared by forming an oxide layer 202A, and the patterned photoresist layer for locations of bonding indium bumps 204, and a metalization layer 202B of Cr/Pt/Au for the lift-off process.

A thin indium layer is deposited on both the top surface of gold of the layer 102B on the carrier wafer 100 and the top surface of gold of the layer 202B on the device wafer 200. Since the indium layer uniformly wets the Au layer, the Au acts as a "substrate" for the subsequent hermetic bonding. This hermetic bonding process can essentially eliminate the air trapped in the bonding interfaces and to prevent adverse effects of the trapped air on the transferred membrane, in particular, a thin membrane with a thickness on the order microns or less, in subsequent selective etch processes. Because indium is known to instantly oxidize in air and the oxidized indium does not provide hermetic bonding, the indium deposition process is followed by the deposition of a thin layer of gold of about 0.01 micron on the top surface of the indium layer to prevent the indium from oxidation. The deposited metal layers for bonding are patterned using a lift-off process to form the bonding indium bumps 107 and 204 as shown in FIG. 1B. This completes the wafer preparation.

Next, the carrier wafer 100 is subsequently bonded to the device wafer 200. An Electronic Vision aligner and a thermo-compression bonder may be respectively used to align and bond two patterned wafers 100 and 200 so that the surfaces with indium bumps 107 and 204 of the two wafers face each other and each indium bump 107 on the wafer 100 is aligned to a respective indium pump 204 on the wafer 204. The bond chamber may be pumped down to a vacuum environment with a low pressure of about, e.g., 1×10$^{-5}$ Torr, before pressing the two wafers 100 and 200 against each other. A piston pressure of about 4 kPa may be applied at an elevated temperature near the melting point of indium at about 156° C. in a vacuum chamber to press the wafers 100 and 200 against each other. This process can produce a complete hermetic sealing between a pair of indium bumps 107 and 204 to form a joint indium bump 210 (FIG. 2). The hermetically-sealed bonding interface in each pair of indium bumps does not trap or absorb air. This substantially reduces the possibility of degassing from the bonding interface during the etching process which may damage the thin membrane 101 to be transferred.

Figure 3A:
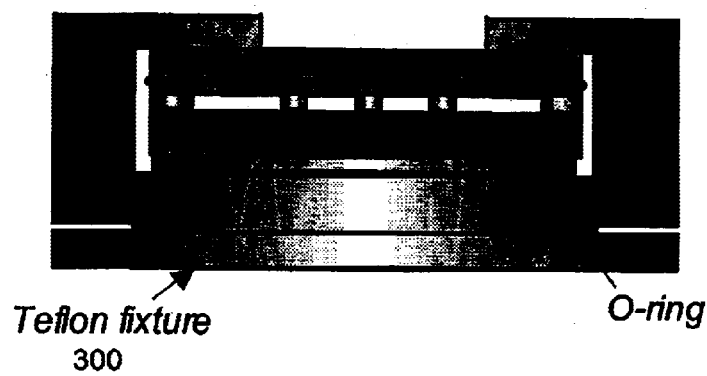
FIGS. 3A, 3B, and 3C illustrate selective etching of the bonded carrier wafer according to one embodiment.

The selective etching stage is then performed after the hermetic bonding. Initially, bonded wafers 100 and 200 shown in FIG. 2 is placed in a chemical wet etching device in a way to expose only the central portion 220 of the carrier wafer 200 to the etching chemicals and to insulate remaining portion of the wafers 100 and 200, including the peripheral region 230, bonded interfaces in the joint indium bumps 210, the device wafer 200. This isolation allows only selected portions of the wafer 200 to be etched and protects other parts. As illustrated in FIG. 3A, a Teflon fixture 300 may be used to protect the backside of the wafer pair as well as their bonded interface.

Figure 3B:
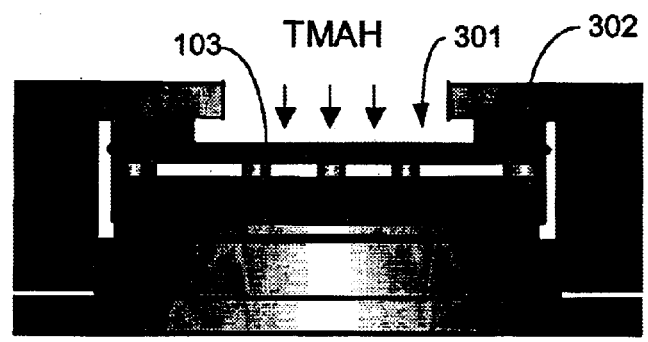
Figure 3C:
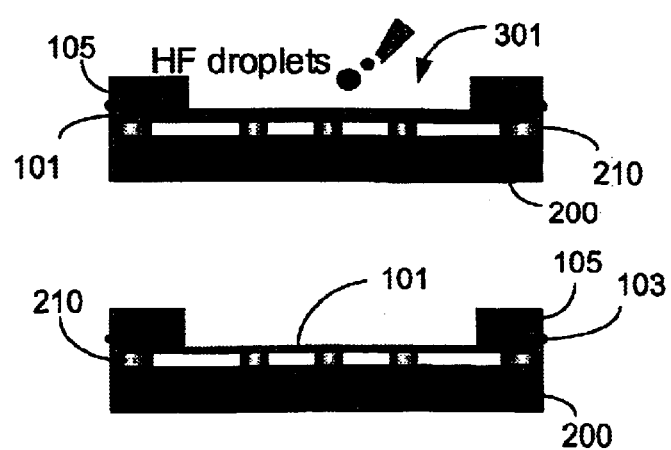

The selective etching is performed in 3 etching steps. First, the bulk of the silicon in the central region 220 of the silicon layer 105 is etched away by a wet etching process which may be performed by exposing the central region 220 of the silicon layer 105 in a 25 wt % Tetramethylammonium hydroxide (TMAH) bath at about 80° C. until the buried oxide layer 103 is exposed. Other etching chemicals such as KOH may also be used in the wet etching process. This produces a central opening 301 in the carrier wafer 100 and leaves the peripheral portion 302 unchanged due to the isolation by the Teflon fixture (FIG. 3B). Second, the exposed insulator layer 103, i.e., the oxide layer in this example, is removed by first an ashing process by using an oxygen plasma in a plasma etching chamber to remove a bulk part and then by using dilute hydrofluoric acid (49% HF) droplets to remove the residual oxide. This process exposes the membrane 101 in the opening 301 (FIG. 3C).

Figure 4A:
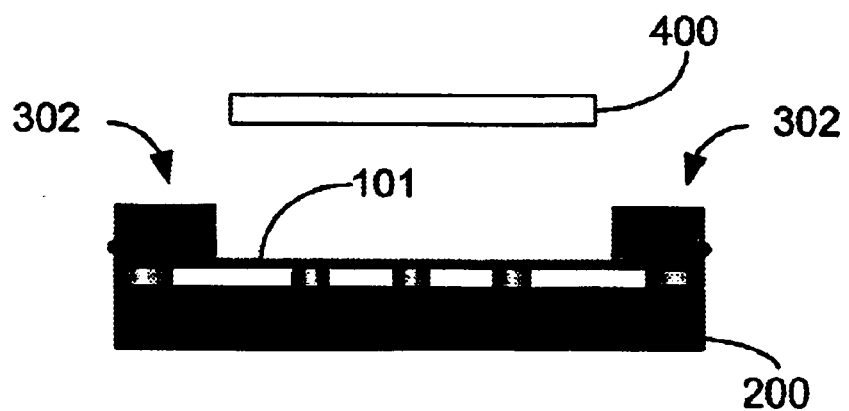
FIGS. 4A and 4B illustrate the final fabrication step to complete the transfer of the membrane to the device substrate according to one embodiment.
Figure 4B:
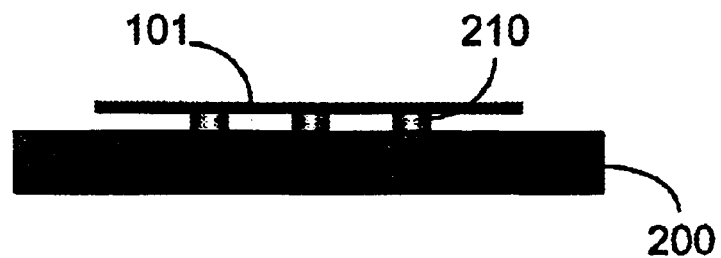

Next, the remaining peripheral region 302 of the wafer 200 is removed by a reactive ion etching process. This may be achieved by using a shadow mask 400 to block the exposed membrane 101 and applying the SF6 plasma to selectively etch the region 302 (FIG. 4A). The shadow mask 400 may also be designed to pattern the transferred membrane 101. FIG. 4B shows the final structure with the membrane 101 integrated on the device wafer 200.

Figure 5A:
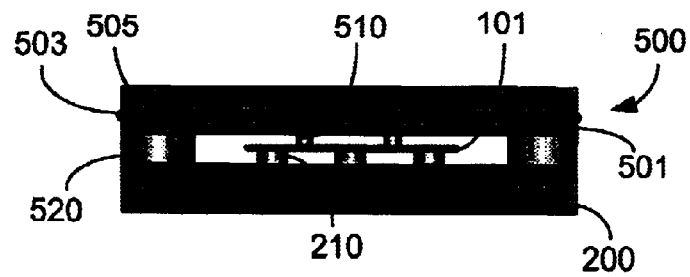
FIGS. 5A, 5B, 5C, and 5D illustrate additional fabrication steps for transferring a second membrane on a second carrier wafer onto the device wafer according to one embodiment, where the second membrane is stacked over the first transferred membrane.
Figure 5B:
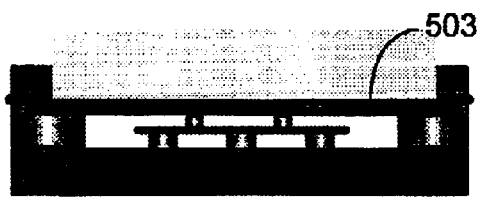
Figure 5C:
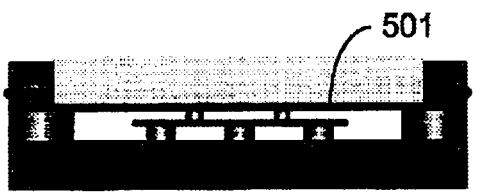
Figure 5D:
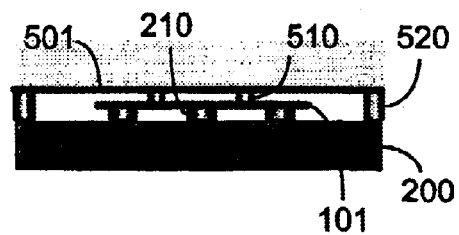

The above membrane transfer process may be repeated to transfer additional membranes to the device wafer 200 on top of the transferred membrane 101. FIGS. 5A–5D illustrates the steps of transferring a second membrane 501 from a second carrier wafer 500, which may be formed of silicon or a different material. FIG. 5A shows that the carrier wafer 500 may be similarly structured as the carrier wafer 100 with an insulator layer 503 sandwiched between the membrane 501 and a semiconductor layer 505. Indium bumps are formed on top of the membrane 101 and to be bonded to indium bumps formed on the surface of the membrane 501 of the carrier wafer 500 to form the joint indium bumps 510. In addition, larger joint indium bumps 520 are also formed between the membrane 501 and the top surface of the device wafer 200 in the peripheral region. Similar etching steps are performed to first remove the central portion of the silicon layer 505 to expose the insulator layer 503 (FIG. 5B) and the to remove the insulator layer 503 to expose the membrane 501 (FIG. 5C). Finally, the peripheral region of the wafer 500 is removed to form the final structure shown in FIG. 5D.

The above membrane transferring techniques may be applied to form a wide range of structures. The following sections describe fabrication of two exemplary deformable mirrors based on the membrane transfer.

Figure 6A:
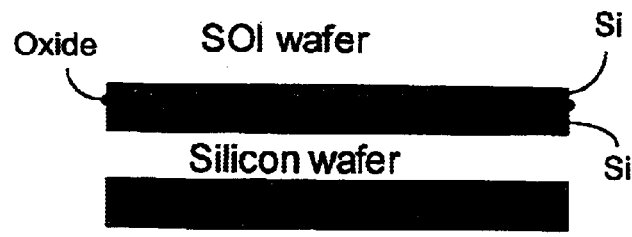
FIGS. 6A through 6L illustrate fabrication of a deformable mirror and associated electrostatic actuators based on the disclosed membrane transfer.
Figure 6B:
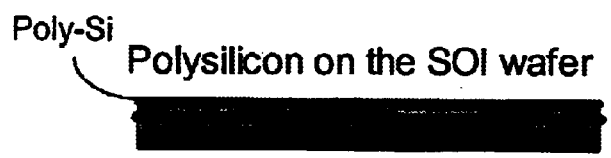

FIGS. 6A–6L illustrate fabrication of a deformable mirror where both the mirror and the underlying actuators are fabricated by the membrane transfer process. FIG. 6A shows a SOI carrier wafer and silicon device wafer are prepared. In FIG. 6B, a 1-micron thick corrugated polysilicon membrane is fabricated on the SOI wafer and is doped to be conductive as part of an electrostatic actuator array on the device wafer that deform the mirror. The corrugated structure is designed to control the deflection of the actuator and to release the stress caused by the bonding and deposition process and the intrinsic stress of membrane materials.

Figure 6C:
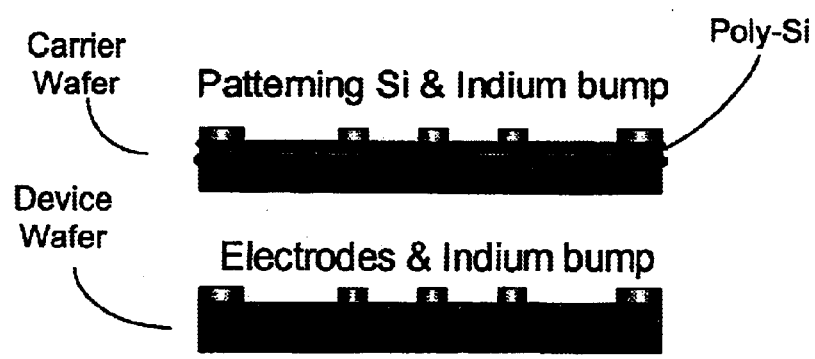
Figure 6D:
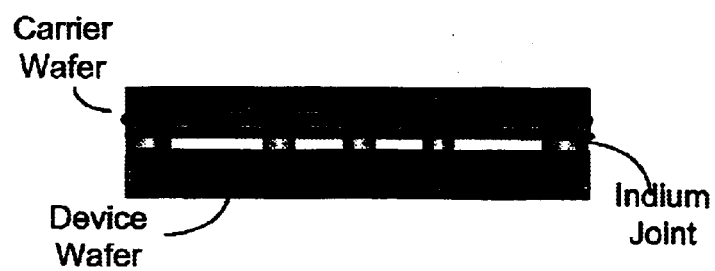

In the wafer preparation shown in FIGS. 6A through 6C, an oxide layer of about 0.5 micron thick is thermally grown on both sides of the wafers. Then Ti/Pt/Au metallization is deposited and patterned to form the electrode array on the device wafer. The carrier wafer is patterned and etched to define a 5-micron deep corrugation profile. A 1-micron thick polysilicon film is deposited on the carrier wafer after thermal oxidation to conform with the corrugation profile in the underlying silicon. This corrugated polysilicon membrane is later transferred to the device wafer. A Cr/Pt/Au metallization is deposited subsequently over the photoresist patterns on both wafers for the lift-off process. A thin indium layer is then deposited on both wafers. The indium deposition process is followed by the deposition of a gold contact layer of about 0.01 micron thick to prevent the indium from oxidation. The deposited metal layers for bonding are patterned using a lift-off process. The carrier wafer is subsequently bonded to the device wafer (FIG. 6D).

Figure 6E:
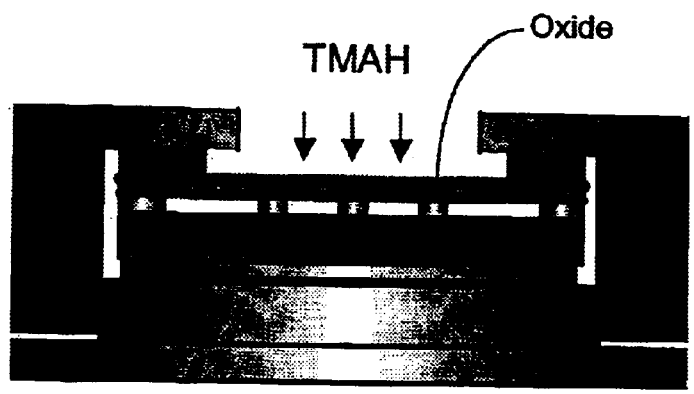
Figure 6F:
Figure 6G:
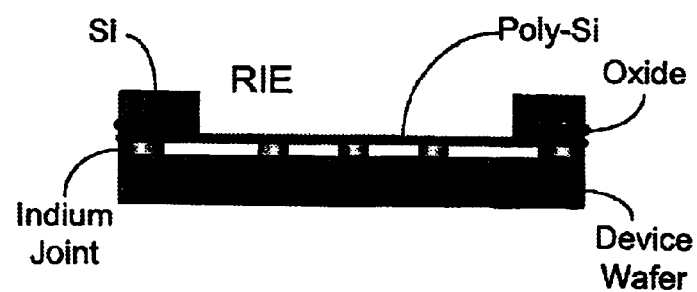
Figure 6H:
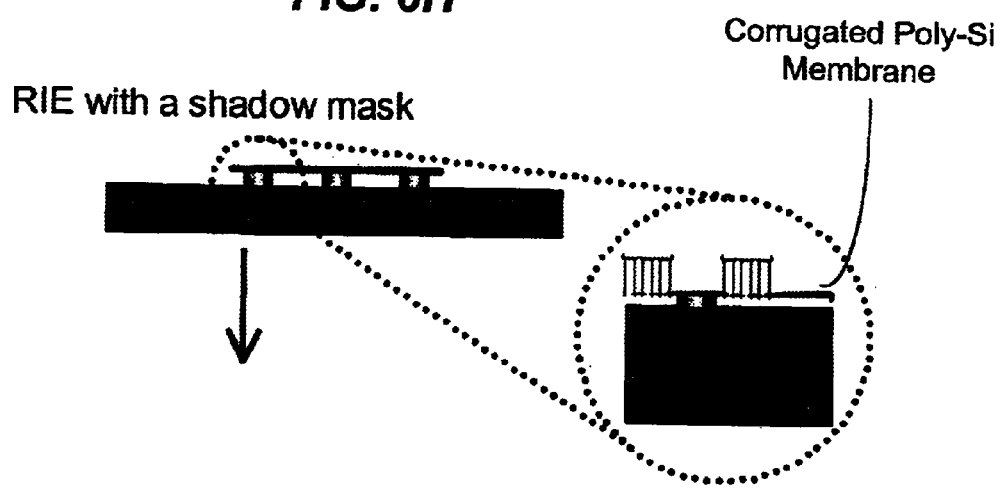
Figure 6I:
Figure 6J:
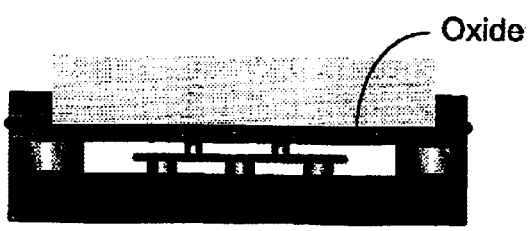
Figure 6K:
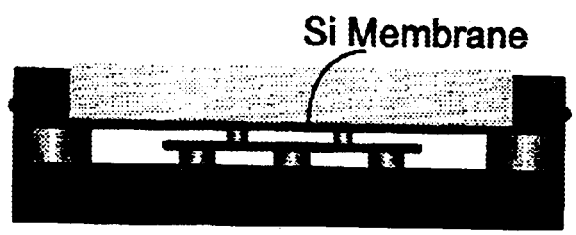
Figure 6L:
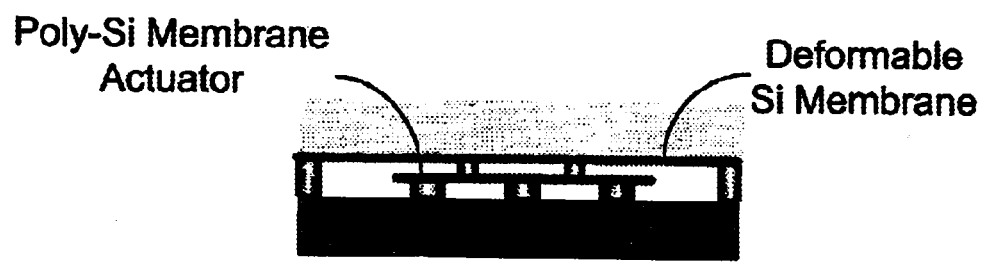
Figure 6M:
FIG. 6M shows operation of the deformable mirror shown in FIG. 6L.
Figure 7A:
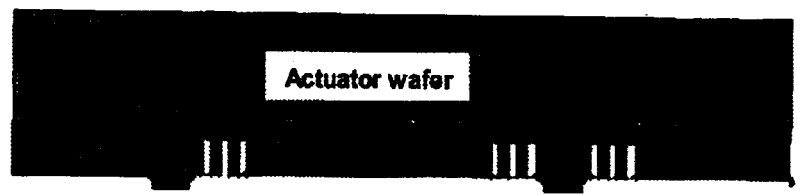
FIGS. 7A, 7B, and 7C show additional details of the deformable mirror shown in FIG. 6L.
Figure 7B:
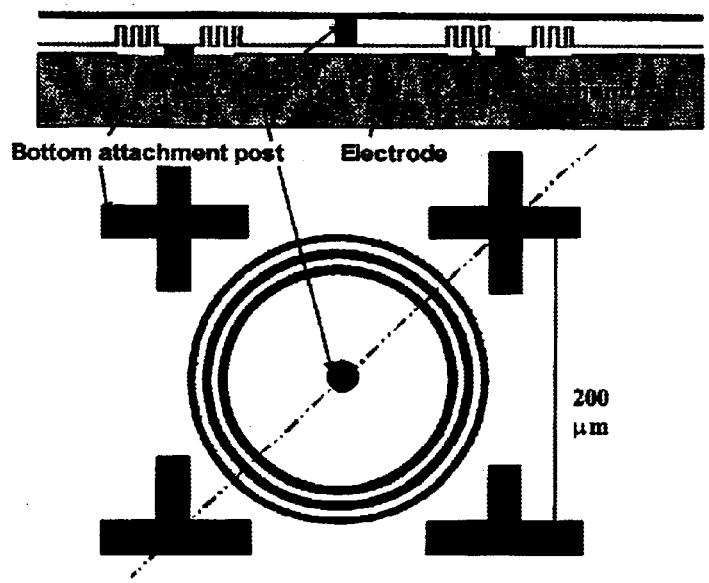
Figure 7C:
Figure 8A:
FIGS. 8A, 8B, 8C, and 8D show fabrication of a different deformable mirror by directly transferring a silicon membrane over an array of actuators on the device wafer based on the disclosed membrane transfer.
Figure 8B:
Figure 8C:
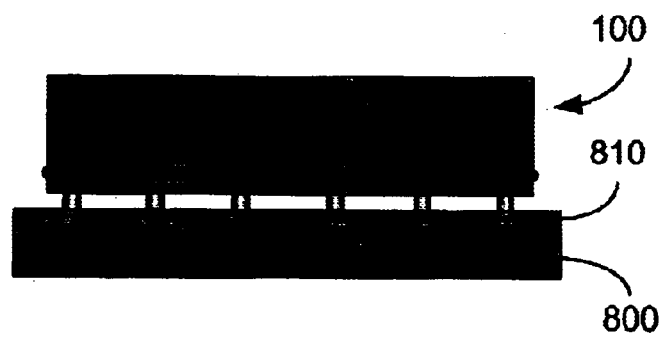
Figure 8D:
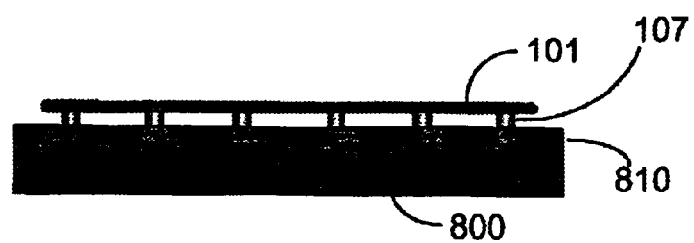

FIGS. 6E–6G illustrate the etching process. In addition to the steps shown in FIGS. 3A–3C, an oxygen plasma is used to remove possible residues on the polysilicon membrane surface after the oxide insulator layer is removed. FIG. 6H shows the structure after a SF6 plasma is used with a shadow mask to selectively etch the polysilicon membrane to pattern the transferred membrane structure. This completes the construction of the actuator array where the conductive membrane and the underlying electrodes on the top surface of the device wafer form electrostatic actuators to locally deform the membrane based on the local voltages. FIGS. 6I–6L show the subsequent transfer of a silicon membrane onto the top of the polysilicon membrane actuator to operate as the deformable mirror. FIG. 6M shows different voltages are applied to two adjacent electrodes on the device wafer to cause different local deformations. FIGS. 7A–7C show additional details of the deformable mirror device in FIG. 6L.

FIGS. 8A–8D show fabrication of another deformable mirror where a reflective silicon membrane 101 in a SOI carrier wafer is directly transferred onto an array of actuators 810 formed on a device wafer 800. The actuators 810 may be previously fabricated on the wafer 800.

In the above embodiments, individual indium bumps are used as the interfacing structures to bond the transferred membrane to the device wafer. Many other materials may also be used to replace the indium for bonding. For example, an epoxy may be used to form the bumps to bond the membrane either directly to the device wafer or to another membrane on the device wafer. This is possible in part because the bonding interface is isolated from the etching chemicals as illustrated in FIG. 3A where a Teflon fixture is used to prevent the etching solution from contacting the bonding interface. The use of an epoxy for bonding can be advantageous because the additional metal layers and processing steps associated with indium bonding can be eliminated to simplify fabrication and to increase fabrication throughput. The epoxy bonding may be particularly advantageous for bonding thick membranes with a thickness on the order of $10^2$ microns. Like the indium bonding where individual indium bumps are used to reduce the contact areas, the epoxy bonding should also be implemented by individual epoxy bumps to reduce the contact areas and hence the problems of stresses at the contacts between the epoxy and the membrane.

The above wafer-level transfer of a membrane has a number of advantages. For example, the transfer can be designed to avoid the use of adhesives or polymers (i.e. wax, epoxy, or photoresist) for bonding the membrane to the device wafer. This can eliminate residues or cracks and maintain a clean mirror membrane. Also, a continuous membrane with a usable area up to the size of the carrier wafer can be transferred in its entirety. Transfer of a 1-micron thick silicon membrane with a diameter of 100 mm has been demonstrated. This availability of a large, continuous membrane may be particularly useful in various applications including adaptive optics where discontinuities can lead to phase errors and other adverse effects.

Only a few embodiments are disclosed. However, it is understood that variations and enhancements may be made without departing from the spirit of and are intended to be encompassed by the following claims.

What is claimed is:

1. A method, comprising:
   causing a carrier wafer to be fabricated to include a membrane on one side of said carrier wafer;
   causing said membrane on said carrier wafer to bond to a surface of a different, device wafer by a plurality of joints;
   causing said joints and said device wafer to be isolated from exposure to an etching chemical; and
   causing said carrier wafer to be selectively etched away to expose said membrane and to leave said membrane on said device wafer,
   wherein said joints are indium bumps and are formed by:
      causing a first set of indium bumps to be formed on said membrane on said carrier wafer and a second, corresponding set of indium bumps to be formed on said device wafer, and
      causing said first set of indium bumps to hermetically bond to said second set of indium bumps to form joint indium bumps to engage said carrier wafer to said device wafer.

2. The method as in claim 1, wherein said carrier wafer includes a carrier semiconductor wafer and an insulator layer sandwiched between said carrier semiconductor wafer and said membrane, and wherein said selective etching of said carrier wafer includes:
   causing a first etching process to be performed to remove at least a portion of said carrier semiconductor wafer to expose said insulator layer; and
   causing a second etching process to be performed to remove said exposed portion of said insulator layer to expose a portion of said membrane.

3. The method as in claim 2, wherein said first etching process is a wet chemical etching process and said second etching process includes a plasma etching process.

4. The method as in claim 3, wherein said carrier semiconductor wafer includes silicon and said insulator layer includes a silicon-containing insulator material, wherein said first etching process uses a Tetramethylammonium hydroxide solution or a KOH solution.

5. The method as in claim 2, further comprising causing said device wafer to be formed from silicon, germanium, a III–V compound, or a II–VI compound.

6. The method as in claim 1, wherein said hermetic bonding is formed by pressing said carrier and said device wafers against each other at an elevated temperature under a low pressure to directly bond said first and said second sets of indium bumps without applying an adhesive therebetween.

7. The method as an claim 1, further comprising causing a metalization layer to be formed between each indium bump and each of said carrier and said device wafers to have a gold contact layer in direct contact with each indium bump.

8. The method as in claim 7, wherein said metalization layer includes a layer of platinum (Pt) underneath said gold contact layer.

9. The method as in claim 1, further comprising:
causing a second carrier wafer to be fabricated to include a second membrane on one side of said second carrier wafer;
causing said second membrane on said carrier wafer to bond to said membrane by a plurality of second joints and to bond to said device wafer by a plurality of third joints;
causing said joints, said membrane, and said device wafer to be isolated from exposure to etching chemicals, and
causing said second carrier wafer to be selectively etched away to expose said second membrane and to leave said second membrane on said membrane and said device wafer.

10. The method as in claim 1, wherein the carrier wafer is a silicon wafer.

11. The method as in claim 1, wherein the device wafer is a silicon wafer.

12. The method as in claim 1, wherein the carrier wafer is formed of a semiconductor different from silicon.

13. The method as in claim 1, wherein the device wafer is formed of a semiconductor different from silicon.

14. The method as in claim 1, wherein an isolation fixture is used to provide the isolation.

15. The method as in claim 1, further comprising transferring a second membrane to said device wafer, wherein said second membrane is supported by indium bumps on said membrane and indium bumps on said device wafer.

16. The method as in claim 1, further comprising:
prior to bonding said membrane on said carrier wafer to said surface of said device wafer by said joints, forming a plurality of actuators on said surface of said device wafer; and
forming the joints on said actuators, respectively.

17. A method, comprising:
causing a carrier wafer to be fabricated to include a support semiconductor wafer, a membrane on one side of said support semiconductor wafer, and an insulator layer sandwiched between said membrane and said support semiconductor wafer;
causing a first set of indium bumps to be formed on said membrane on said carrier wafer and a second, corresponding set of indium bumps to be formed on a separate device wafer;
causing said first set of indium bumps to hermetically bond to said second set of indium bumps to form joint indium bumps to engage said carrier wafer to said device wafer;
causing said joint indium bumps and said device wafer to be isolated from exposure to an etching chemical; and
causing said carrier wafer to be selectively etched away to expose said membrane and to leave said membrane on said device wafer.

18. The method as in claim 17, further comprising causing a metalization layer to be formed between each indium bump and each of said carrier and said device wafers to have a gold contact layer in direct contact with each indium bump.

19. The method as in claim 18, wherein said metalization layer includes a layer of platinum (Pt) underneath said gold contact layer.

20. The method as in claim 17, wherein each set of indium bumps is formed by forming a layer of indium and patterning said layer of indium by a lift-off process.

21. The method as in claim 17, wherein said hermetic bonding is formed by pressing said carrier and said device wafers directly against each other at an elevated temperature under a vacuum condition to form a hermetic bond between said first and said second sets of indium bumps without applying an adhesive therebetween.

22. The method as in claim 17, wherein said selective etching of said carrier wafer includes:
causing a wet etching process to be performed to remove at least a portion of said support semiconductor wafer to expose said insulator layer; and
causing a plasma etching process to be performed to remove said exposed portion of said insulator layer to expose a portion of said membrane.

23. The method as in claim 22, further comprising causing liquid etching drops to be applied subsequent to said plasma etching process to remove residue of said insulator layer.

24. The method as in claim 17, further comprising causing another plasma etching process to be formed to pattern said membrane by using a shadow mask.

25. The method as in claim 17, further comprising causing a layer of gold of to be deposited over each indium bump to prevent oxidation.

26. The method as in claim 17, wherein the carrier wafer is a silicon wafer.

27. The method as in claim 17, wherein the device wafer is a silicon wafer.

28. The method as in claim 17, wherein the carrier wafer is formed of a semiconductor different from silicon.

29. The method as in claim 17, wherein the device wafer is formed of a semiconductor different from silicon.

30. The method as in claim 17, wherein an isolation fixture is used to provide the isolation.

31. The method as in claim 17, further comprising:
causing a second carrier wafer to be fabricated to include a second support semiconductor wafer, a second membrane on one side of said second support semiconductor wafer, and a second insulator layer sandwiched between said second membrane and said second support semiconductor wafer;
causing a first set of indium bumps to be formed on said second membrane on said second carrier wafer and a second, corresponding set of indium bumps to be formed on selected locations on said device wafer and on a top of said membrane;
causing said first set of indium bumps to hermetically bond to said second set of indium bumps to form joint indium bumps to engage said second carrier wafer to said membrane and said device wafer;
causing said joint indium bumps, said membrane, and said device wafer to be isolated from exposure to an etching chemical; and
causing said second carrier wafer to be selectively etched away to expose said second membrane and to leave said second membrane on said first membrane and said device wafer.

32. The method as in claim 17, further comprising:
prior to formation of said second, corresponding set of indium bumps on said separate device wafer, forming a plurality of actuators on said device wafer; and
forming said second, corresponding set of indium bumps on said actuators, respectively.

* * * * *